United States Patent
Xu et al.

(10) Patent No.: US 12,046,279 B2
(45) Date of Patent: Jul. 23, 2024

(54) MULTI-PASS PROGRAMMING OPERATION SEQUENCE IN A MEMORY DEVICE

(71) Applicant: SanDisk Technologies LLC, Addison, TX (US)

(72) Inventors: Huiwen Xu, Cupertino, CA (US); Jun Wan, San Jose, CA (US); Bo Lei, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 134 days.

(21) Appl. No.: 17/751,179

(22) Filed: May 23, 2022

(65) Prior Publication Data

US 2023/0377643 A1 Nov. 23, 2023

(51) Int. Cl.
*G11C 16/10* (2006.01)
*G11C 11/56* (2006.01)
*G11C 16/04* (2006.01)
*G11C 16/34* (2006.01)

(52) U.S. Cl.
CPC ...... *G11C 11/5628* (2013.01); *G11C 11/5671* (2013.01); *G11C 16/0483* (2013.01); *G11C 16/10* (2013.01); *G11C 16/3418* (2013.01); *G11C 16/3427* (2013.01)

(58) Field of Classification Search
CPC ............ G11C 11/5628; G11C 11/5671; G11C 16/0483; G11C 16/10; G11C 16/3418; G11C 16/3427
See application file for complete search history.

(56) References Cited

U.S. PATENT DOCUMENTS

| | | | |
|---|---|---|---|
| 9,548,124 B1 * | 1/2017 | Hazeghi | G11C 7/14 |
| 10,510,413 B1 * | 12/2019 | Diep | G11C 16/10 |
| 10,796,766 B2 | 10/2020 | Joe et al. | |
| 10,908,842 B2 | 2/2021 | Oh et al. | |
| 11,107,522 B2 | 8/2021 | El Gamal et al. | |
| 11,133,067 B2 | 9/2021 | Gorobets et al. | |
| 11,137,944 B1 | 10/2021 | Gorobets et al. | |
| 11,410,739 B1 * | 8/2022 | Prakash | G11C 16/0483 |
| 11,468,950 B1 * | 10/2022 | Prakash | G11C 16/0483 |
| 11,475,967 B1 * | 10/2022 | Pitner | G11C 16/26 |
| 2015/0117114 A1 * | 4/2015 | Wan | G11C 11/5642 365/185.21 |
| 2016/0180959 A1 * | 6/2016 | Darragh | G11C 16/12 365/185.09 |
| 2016/0260495 A1 * | 9/2016 | Paudel | G11C 16/26 |

(Continued)

*Primary Examiner* — Mushfique Siddique
(74) *Attorney, Agent, or Firm* — Dickinson Wright PLLC; Steven C. Hurles

(57) ABSTRACT

A controller is configured to program the memory cells to a first set of data states in a first programming pass and to a greater second set of data states in a second programming pass. The controller performs the first programming pass on the first word line. The controller then repeats the process of programming a portion of another word line and then comparing an upper tail of an erased data state of the first word line to a critical voltage until the upper tail of the erased data state of the first word line exceeds the critical voltage by a threshold. In response to the upper tail of the erased data state exceeding the critical voltage by the threshold, the controller then alternates between the first and second programming passes until the first programming pass is completed on the remaining word lines of the memory block.

20 Claims, 19 Drawing Sheets

(56) References Cited

U.S. PATENT DOCUMENTS

| | | | |
|---|---|---|---|
| 2020/0194078 A1* | 6/2020 | Kondo | G11C 16/10 |
| 2022/0392553 A1* | 12/2022 | Wang | G11C 16/0483 |
| 2022/0415399 A1* | 12/2022 | Lien | G11C 16/08 |
| 2023/0377655 A1* | 11/2023 | Xu | G11C 16/3427 |

* cited by examiner

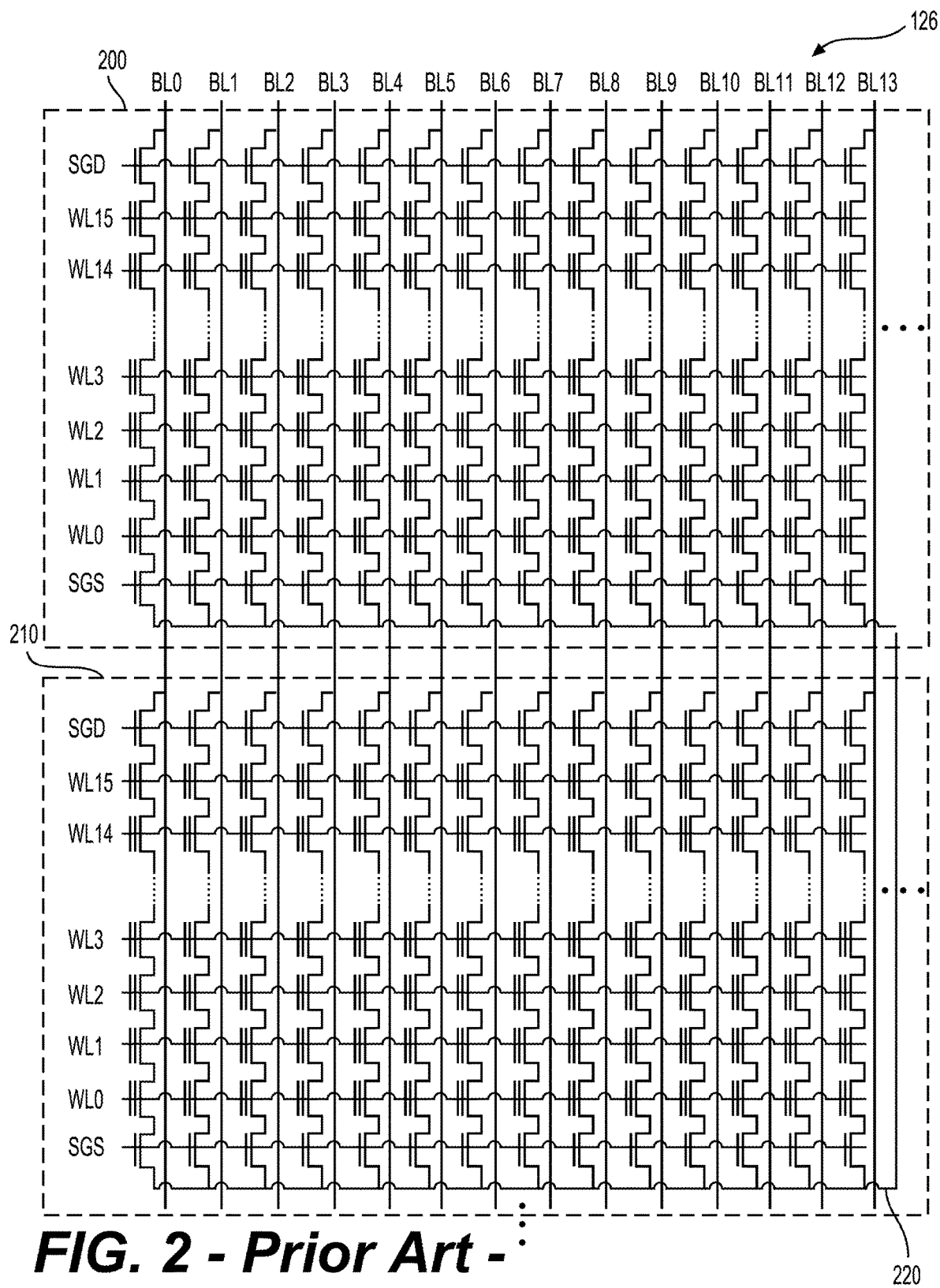
FIG. 2 - Prior Art -

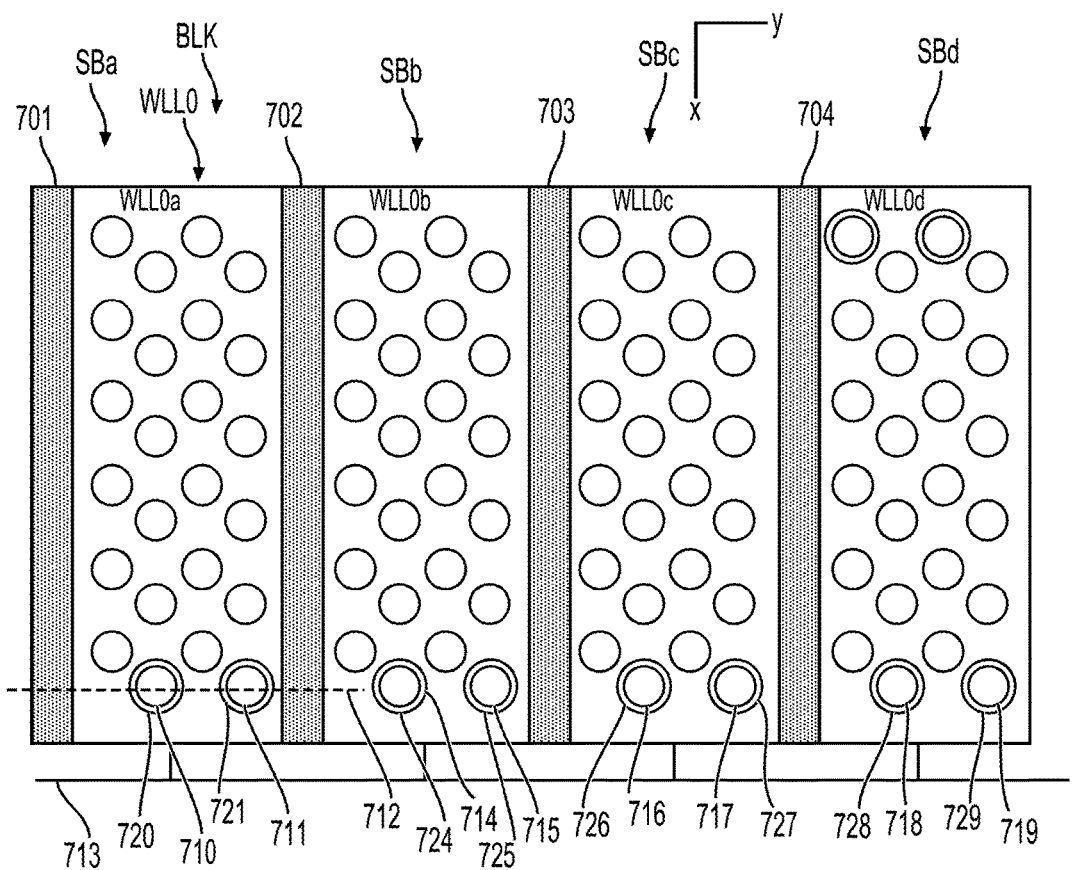
*FIG. 7A - Prior Art -*
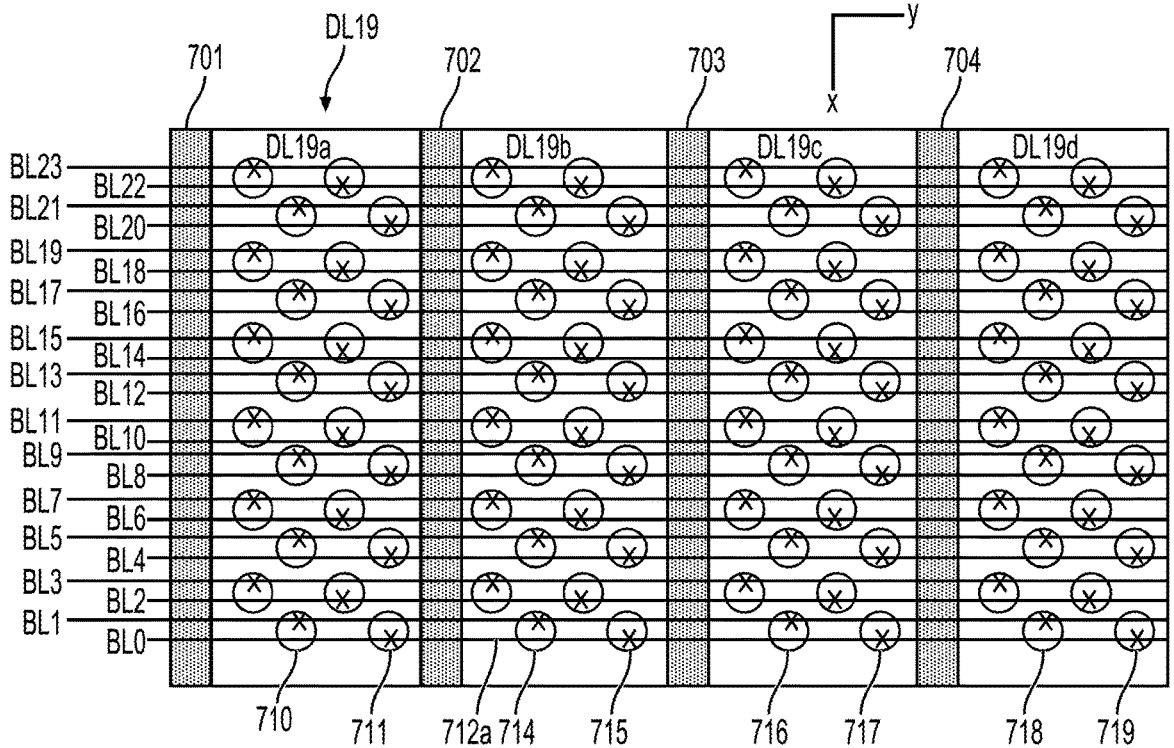
*FIG. 7B - Prior Art -*

| WL | PASS | STRING | | | |
|---|---|---|---|---|---|
| | | 0 | 1 | 2 | 3 |
| 0 | MLC | 1 | 2 | 3 | 4 |
| | FINE | 13 | 14 | 15 | 16 |
| 1 | MLC | 5 | 6 | 7 | 8 |
| | FINE | 21 | 22 | 23 | 24 |
| 2 | MLC | 9 | 10 | 11 | 12 |
| | FINE | 29 | 30 | 31 | 32 |
| 3 | MLC | 17 | 18 | 19 | 20 |
| | FINE | 37 | 38 | 39 | 40 |
| 4 | MLC | 25 | 26 | 27 | 28 |
| | FINE | 45 | 46 | 47 | 48 |
| ... | | | | | |
| n | MLC | 4n+1 | 4n+2 | 4n+3 | 4n+4 |
| | FINE | 4n+4MAX+1 | 4n+4MAX+2 | 4n+4MAX+3 | 4n+4MAX+4 |
| n+1 | MLC | 4(n+1)+1 | 4(n+1)+2 | 4(n+1)+3 | 4(n+1)+4 |
| | FINE | 4(n+1)+4MAX+1 | 4(n+1)+4MAX+2 | 4(n+1)+4MAX+3 | 4(n+1)+4MAX+4 |

FIG. 14

| WL | PASS | STRING | | | |
|---|---|---|---|---|---|
| | | 0 | 1 | 2 | 3 |
| 0 | MLC | 1 | 2 | 3 | 4 |
| | FINE | 8 | 12 | 16 | 20 |
| 1 | MLC | 5 | 9 | 13 | 17 |
| | FINE | 22 | 24 | 26 | 28 |
| 2 | MLC | 6 | 10 | 14 | 18 |
| | FINE | 30 | 32 | 34 | 36 |
| 3 | MLC | 7 | 11 | 15 | 19 |
| | FINE | 38 | 39 | 40 | 42 |
| 4 | MLC | 21 | 23 | 25 | 27 |
| | FINE | 44 | 46 | 48 | 50 |
| 5 | MLC | 29 | 31 | 33 | 35 |
| | FINE | 52 | 54 | 56 | 58 |
| ... | | | | | |

*FIG. 16*

MULTI-PASS PROGRAMMING OPERATION SEQUENCE IN A MEMORY DEVICE

BACKGROUND

1. Field

The present disclosure is related generally to memory devices and more particularly to improved programming sequences or programming orders in a multi-pass programming operation.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

Such non-volatile memory devices generally include a plurality of memory cells that are arranged in memory blocks, which each include a plurality of word lines. The memory cells are configured to be programmed to retain threshold voltages that are associated with programmed data states. A programming operation includes a plurality of program-verify iterations or program loops, each of which includes the application of a programming pulse to a selected word line of the plurality of word lines to inject electrons into a charge trapping material within each memory cell. After each programming pulse, the memory cells of the selected word line can be sensed, or read, to determine if their desired threshold voltages have been reached and, if so, inhibit further programming during later programming pulses. In some cases, this programming operation can occur in multiple programming passes.

SUMMARY

One aspect of the present disclosure is related to a method of programming the memory cells of a memory device. The method includes the step of preparing a memory block that includes a plurality of memory cells arranged in a plurality of word lines. The method continues with the step of performing a first programming pass on all memory cells of a first word line of the plurality of word lines. The method proceeds with repeating the steps of programming at least a portion of another word line of the plurality of word lines and then comparing an upper tail of an erased data state of the first word line to a critical voltage until the upper tail of the erased data state of the first word line exceeds the critical voltage by a threshold. In response to the upper tail of the erased data state exceeding the critical voltage by the threshold, the method continues with alternating between the first and second programming passes until the first programming pass is completed on the remaining word lines of the memory block.

According to another aspect of the present disclosure, the first programming pass is an MLC programming pass, and the first set of data states includes the erased data state and three programmed data states.

According to yet another aspect of the present disclosure, the second programming pass is a fine programming pass and the second set of data state includes the erased data state and fifteen programmed data states.

According to still another aspect of the present disclosure, the step of comparing the upper tail of the erased data state of the first word line to the critical voltage includes performing a sensing operation on the first word line and counting a number of memory cells in the erased data state that have threshold voltages that are greater than the critical voltage.

According to a further aspect of the present disclosure, the memory block includes a plurality of strings, and the step of programming at least a portion of the another word line includes programming the memory cells of all strings of the another word line.

According to yet a further aspect of the present disclosure, the memory block includes a plurality of strings, and the step of programming at least a portion of the another word line includes programming the memory cells of only a single string of the another word line.

According to still a further aspect of the present disclosure, upon completion of the MLC programming pass on all of the word lines of the memory block, the method continues with the step of performing the fine programming pass on any word lines that have only received the MLC programming pass.

Another aspect of the present disclosure is related to a memory device that includes a plurality of memory cells arranged in a plurality of word lines. A controller is in electrical communication with the plurality of memory cells and is configured to program the memory cells to a first set of data states in a first programming pass and to a second set of data states that is greater than the first set of data states in a second programming pass. The controller is further configured to perform the first programming pass on all memory cells of a first word line of the plurality of word lines and repeat the process of programming at least a portion of another word line of the plurality of word lines and then comparing an upper tail of an erased data state of the first word line to a critical voltage until the upper tail of the erased data state of the first word line exceeds the critical voltage by a threshold. In response to the upper tail of the erased data state exceeding the critical voltage by the threshold, the controller is configured to alternate between the first and second programming passes until the first programming pass is completed on the remaining word lines of the memory block.

According to another aspect of the present disclosure, the first programming pass is an MLC programming pass, and the first set of data states includes the erased data state and three programmed data states.

According to yet another aspect of the present disclosure, the second programming pass is a fine programming pass, and the second set of data state includes the erased data state and fifteen programmed data states.

According to still another aspect of the present disclosure, when comparing the upper tail of the erased data state of the first word line to the critical voltage, the controller performs a sensing operation on the first word line and counts a number of memory cells in the erased data state that have threshold voltages that are greater than the critical voltage.

According to a further aspect of the present disclosure, the memory block includes a plurality of strings, and when programming the at least a portion of the another word line, the controller is configured to program the memory cells of all strings of the another word line.

According to yet a further aspect of the present disclosure, the memory block includes a plurality of strings and when programming the at least a portion of the another word line, the controller is configured to program the memory cells of only a single string of the another word line.

According to still a further aspect of the present disclosure, upon completion of the MLC programming pass on all of the word lines of the memory block, the controller is further configured to perform the fine programming pass on any word lines that have only received the MLC programming pass.

Yet another aspect of the present disclosure is related to an apparatus that includes a memory block with a plurality of memory cells arranged in a plurality of word lines. The apparatus also includes a programming means for programming the plurality of memory cells to a first set of data states in a first programming pass and to a second set of data states that is greater than the first set of data states in a second programming pass. The programming means is further configured to perform the first programming pass on all memory cells of a first word line of the plurality of word lines. The programming means is also configured to repeat the process of programming at least a portion of another word line of the plurality of word lines and then determining a failed count, which is the number of memory cells in an erased data state of the first word line that have threshold voltages that are greater than a critical voltage until the failed count exceeds a threshold. In response to the failed count exceeding the threshold, the controller is further configured to alternate between the first and second programming passes until the first programming pass is completed on the remaining word lines of the memory block.

According to another aspect of the present disclosure, the first programming pass is an MLC programming pass, and the first set of data states includes the erased data state and three programmed data states.

According to yet another aspect of the present disclosure, the second programming pass is a fine programming pass, and the second set of data state includes the erased data state and fifteen programmed data states.

According to still another aspect of the present disclosure, the memory block includes a plurality of strings and when programming the at least a portion of the another word line, the programming means is configured to program the memory cells of all strings of the another word line.

According to a further aspect of the present disclosure, the memory block includes a plurality of strings and when programming the at least a portion of the another word line, the programming means is configured to program the memory cells of only a single string of the another word line.

According to yet a further aspect of the present disclosure, upon completion of the MLC programming pass on all of the word lines of the memory block, the programming means is further configured to perform the fine programming pass on any word lines that have only received the MLC programming pass.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 2 depicts blocks of memory cells in an example two-dimensional configuration of the memory array of FIG. 1A;

FIG. 7A depicts a top view of an example word line layer WLL0 of the stack of FIG. 6B;

FIG. 7B depicts a top view of an example top dielectric layer DL116 of the stack of FIG. 6B;

FIG. 14 is a chart illustrating the programming order of an example memory block programmed according to the steps of the FIG. 13 flow chart;

FIG. 16 is a chart illustrating the programming order of an example memory block programmed according to the steps of the FIG. 15 flow chart.

DESCRIPTION OF THE ENABLING EMBODIMENT

The present disclosure is related to an optimized multi-phase programming technique that includes multiple programming passes, namely an MLC and a fine pass. During programming, an optimized number of word lines to be programmed to MLC prior to the start of the fine pass is dynamically determined. From the time that the optimized number of word lines to be programmed to MLC is determined on, programming alternates between the MLC and fine passes so that no more than the optimum number of word lines are programmed to MLC at a time. By following this programming order, tighter threshold voltage distributions can be realized without the consequences of program disturb or NWI attack, which may occur if too many word lines are programmed to MLC prior to the fine pass.

Figure 1A:
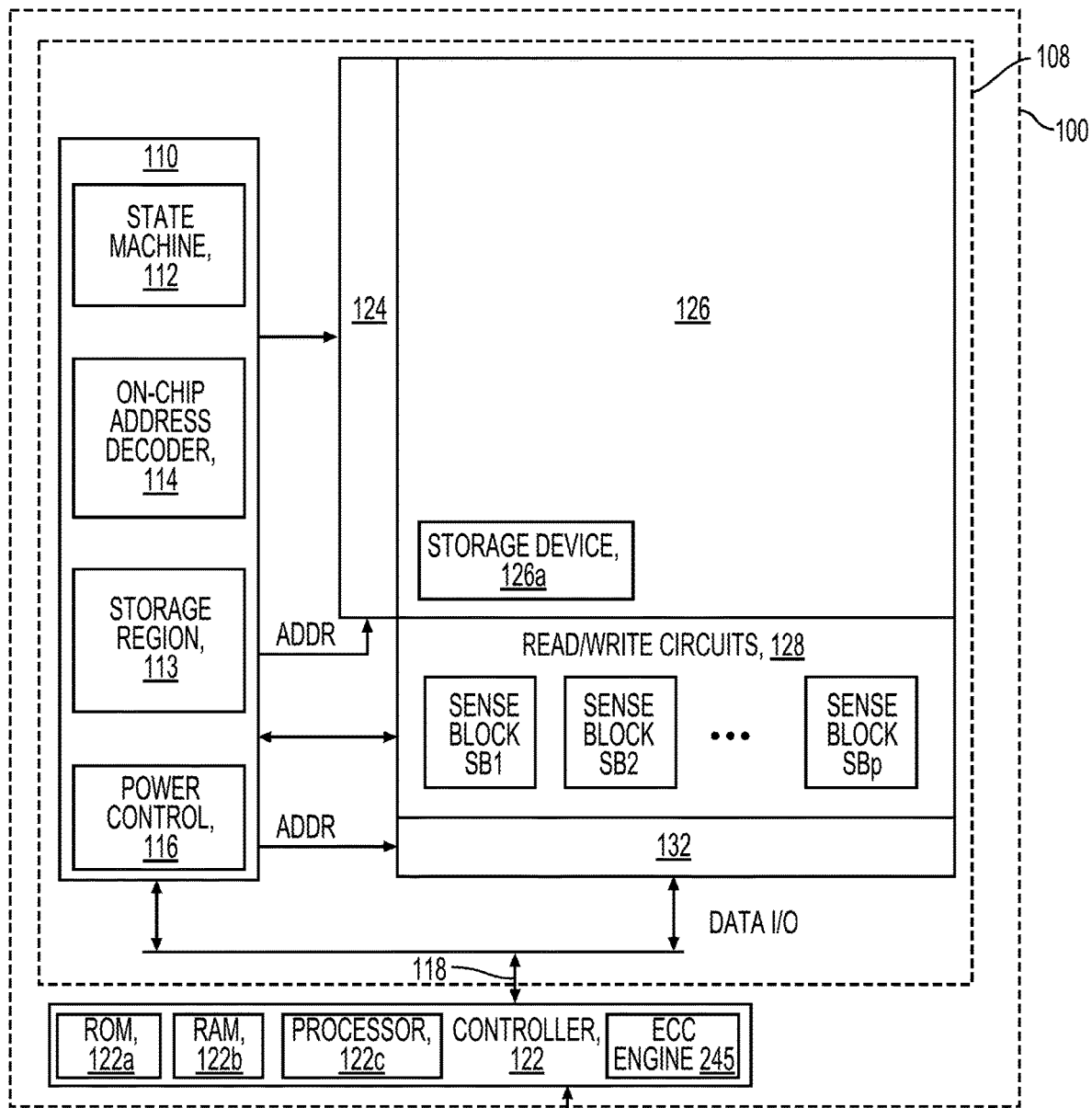
FIG. 1A is a block diagram of an example memory device.

FIG. 1A is a block diagram of an example memory device that is capable of conducting the aforementioned programming techniques. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, ... SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, ..., SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
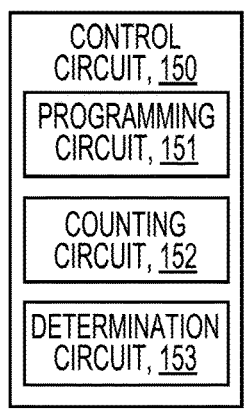
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
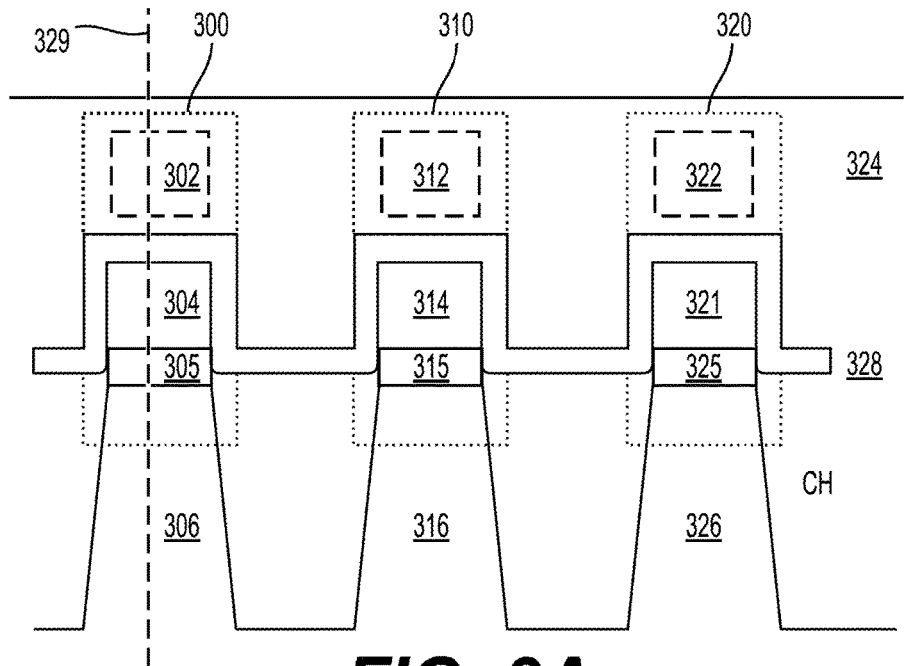
FIG. 3A and FIG. 3B depict cross-sectional views of example floating gate memory cells in NAND strings.
Figure 3B:
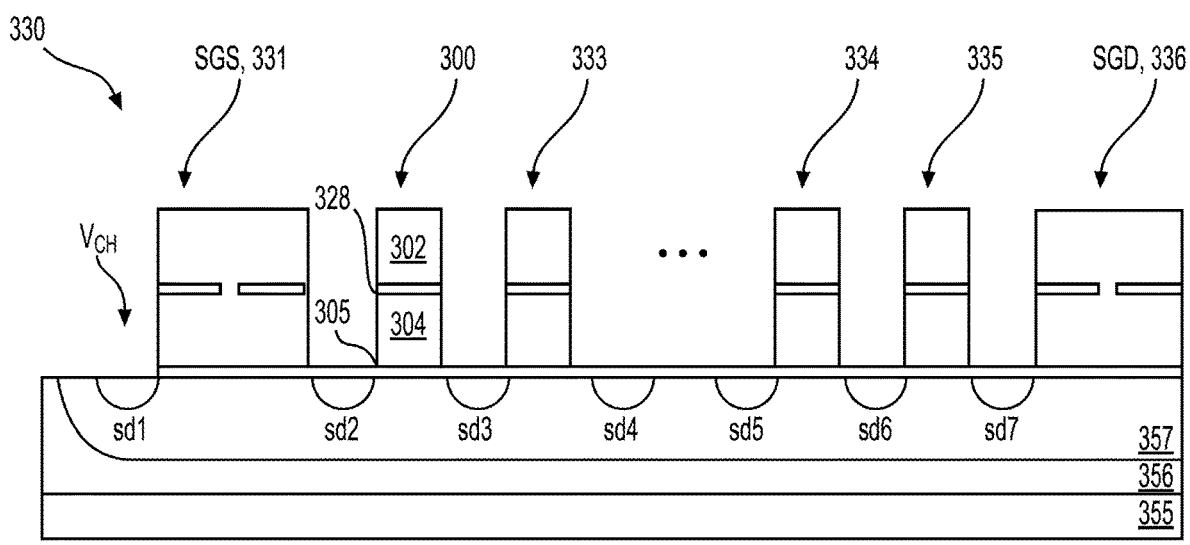

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
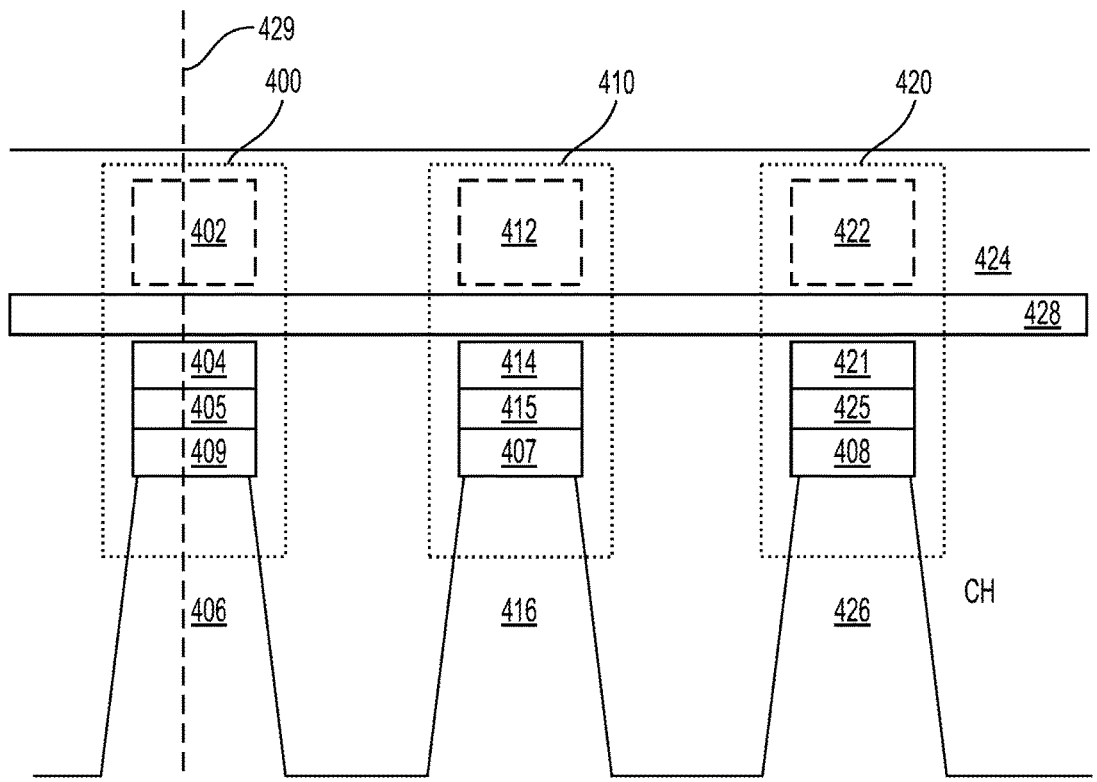
FIG. 4A and FIG. 4B depict cross-sectional views of example charge-trapping memory cells in NAND strings.
Figure 4B:
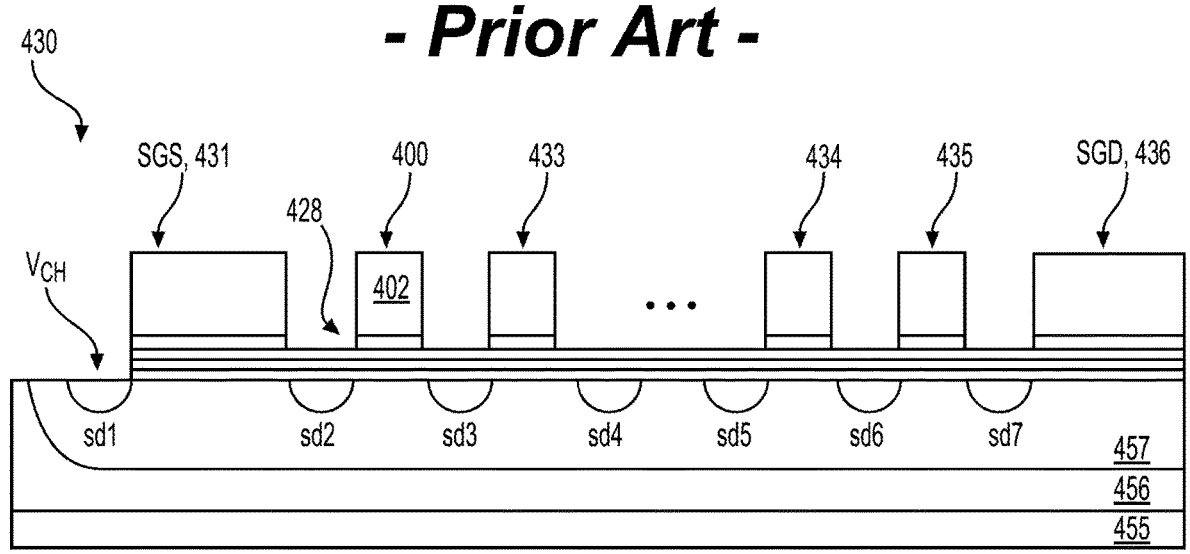

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
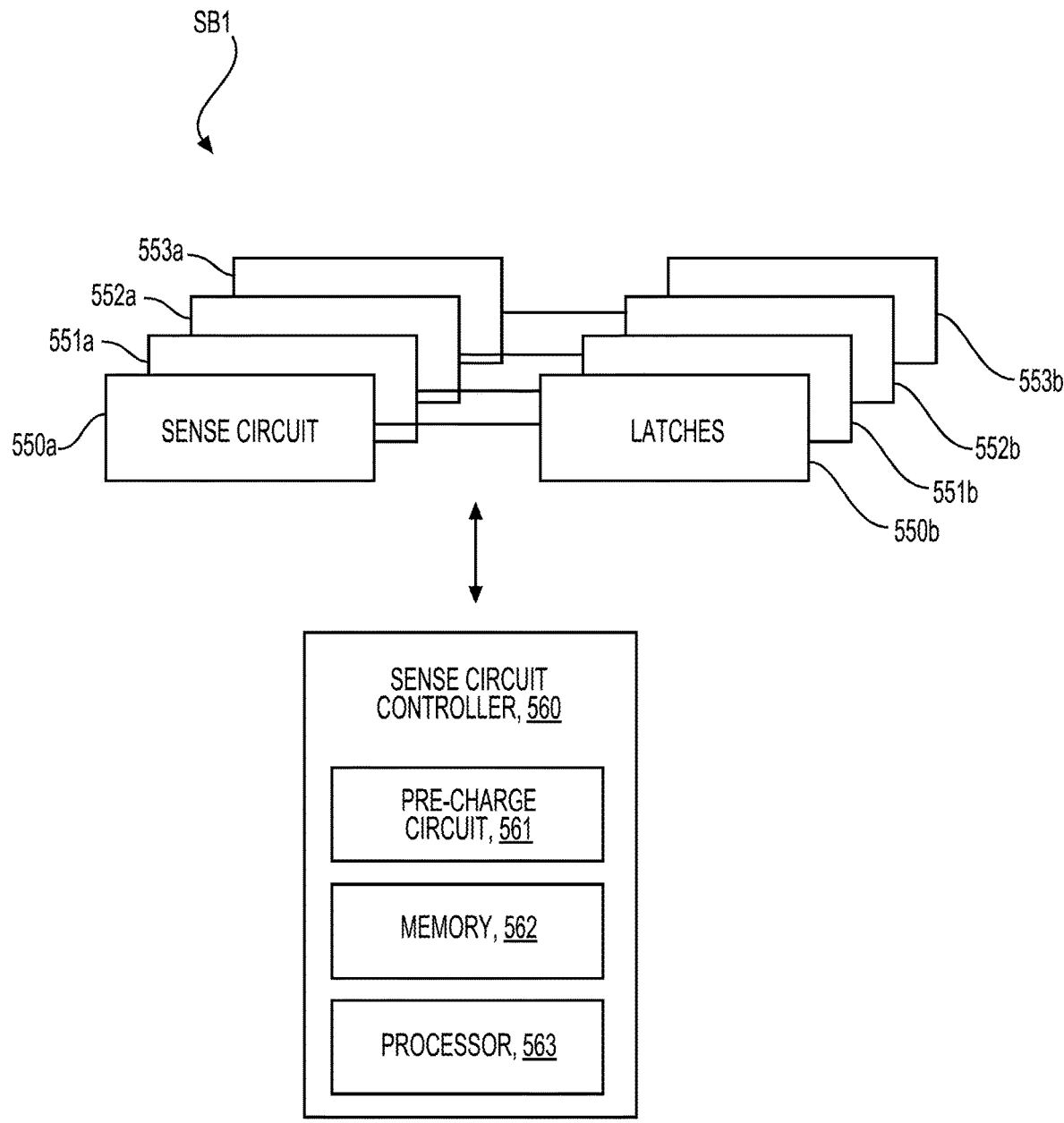
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550*a*, 551*a*, 552*a*, and 553*a* are associated with the data latches 550*b*, 551*b*, 552*b*, and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550$b$, 551$b$, 552$b$, 553$b$ which are associated with the sense circuits 550$a$, 551$a$, 552$a$, 553$a$, setting bit values in the latches and providing voltages for setting pre-charge levels in sense nodes of the sense circuits 550$a$, 551$a$, 552$a$, 553$a$. Further example details of the sense circuit controller 560 and the sense circuits 550$a$, 551$a$, 552$a$, 553$a$ are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
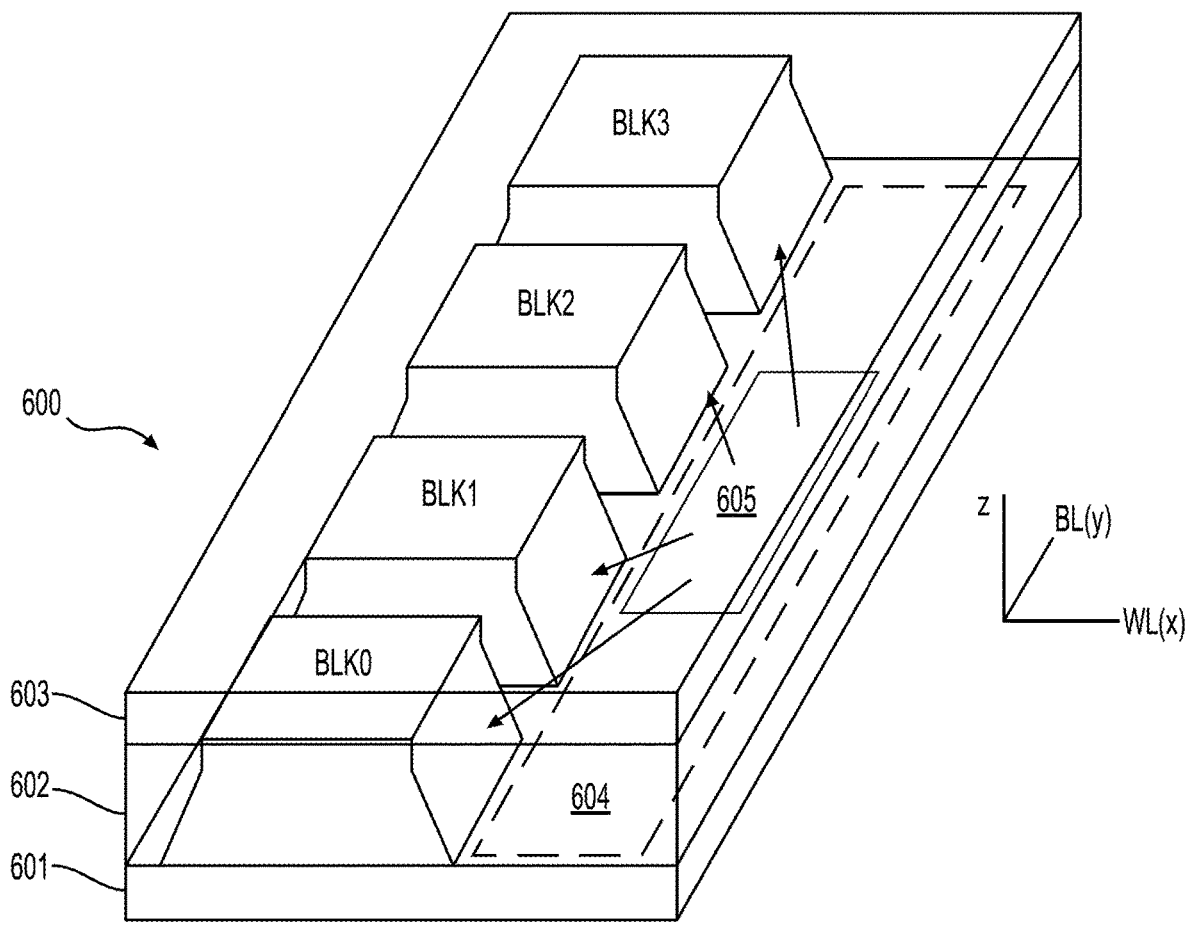
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
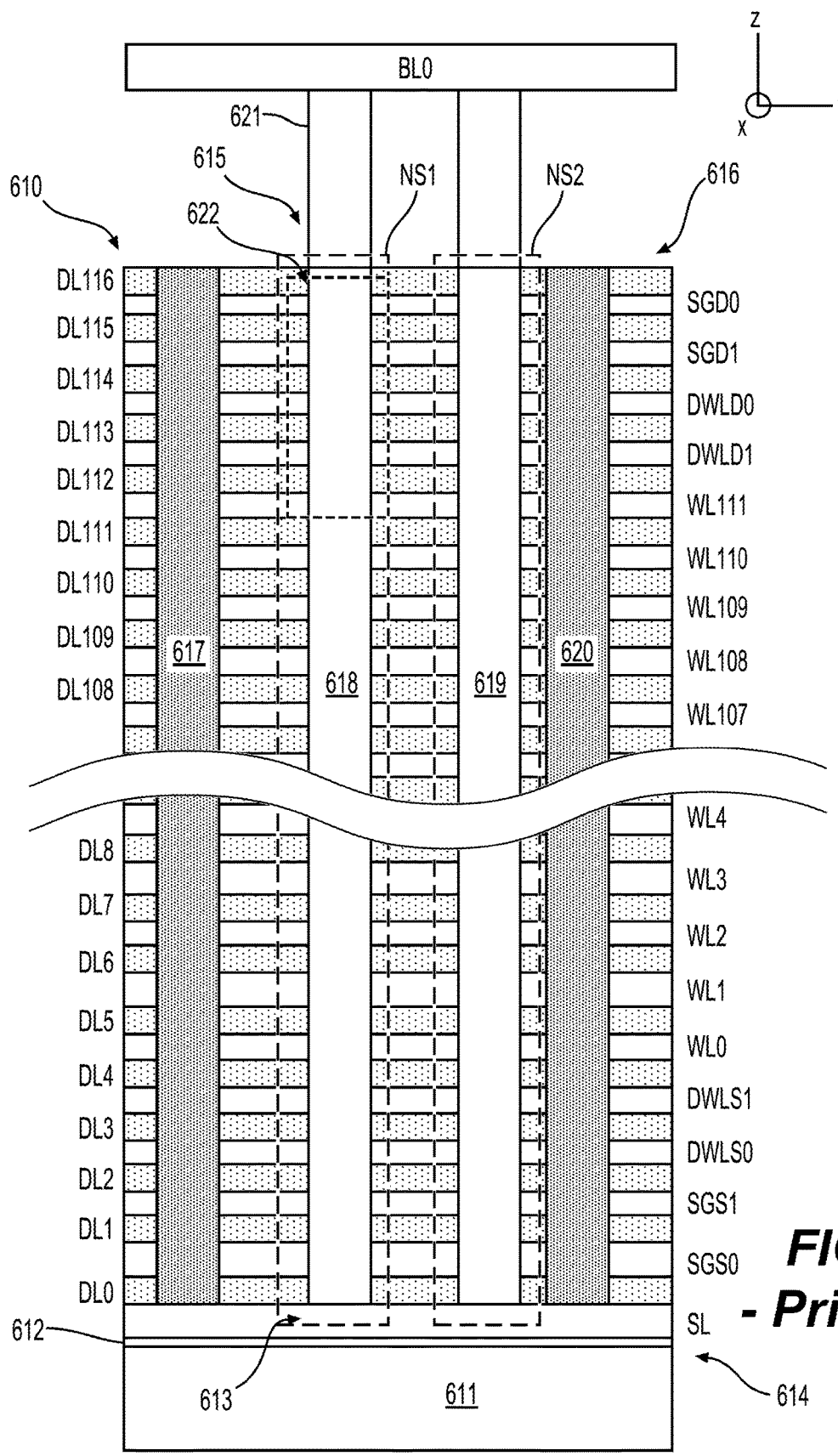
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
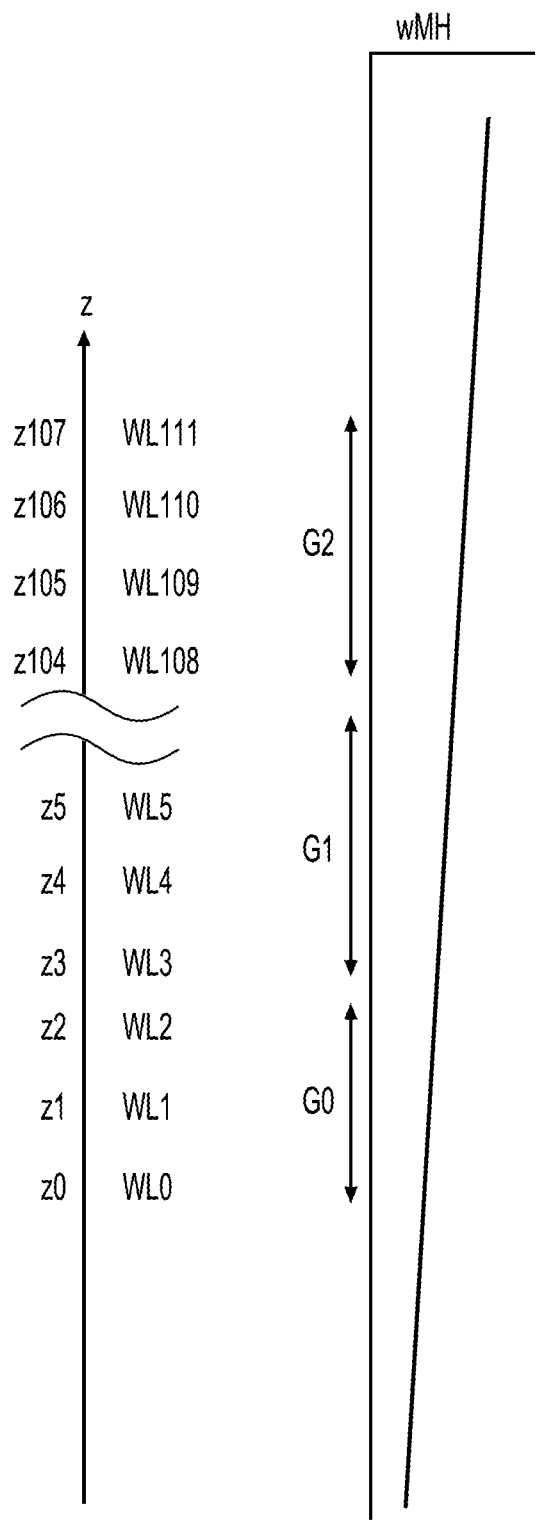
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
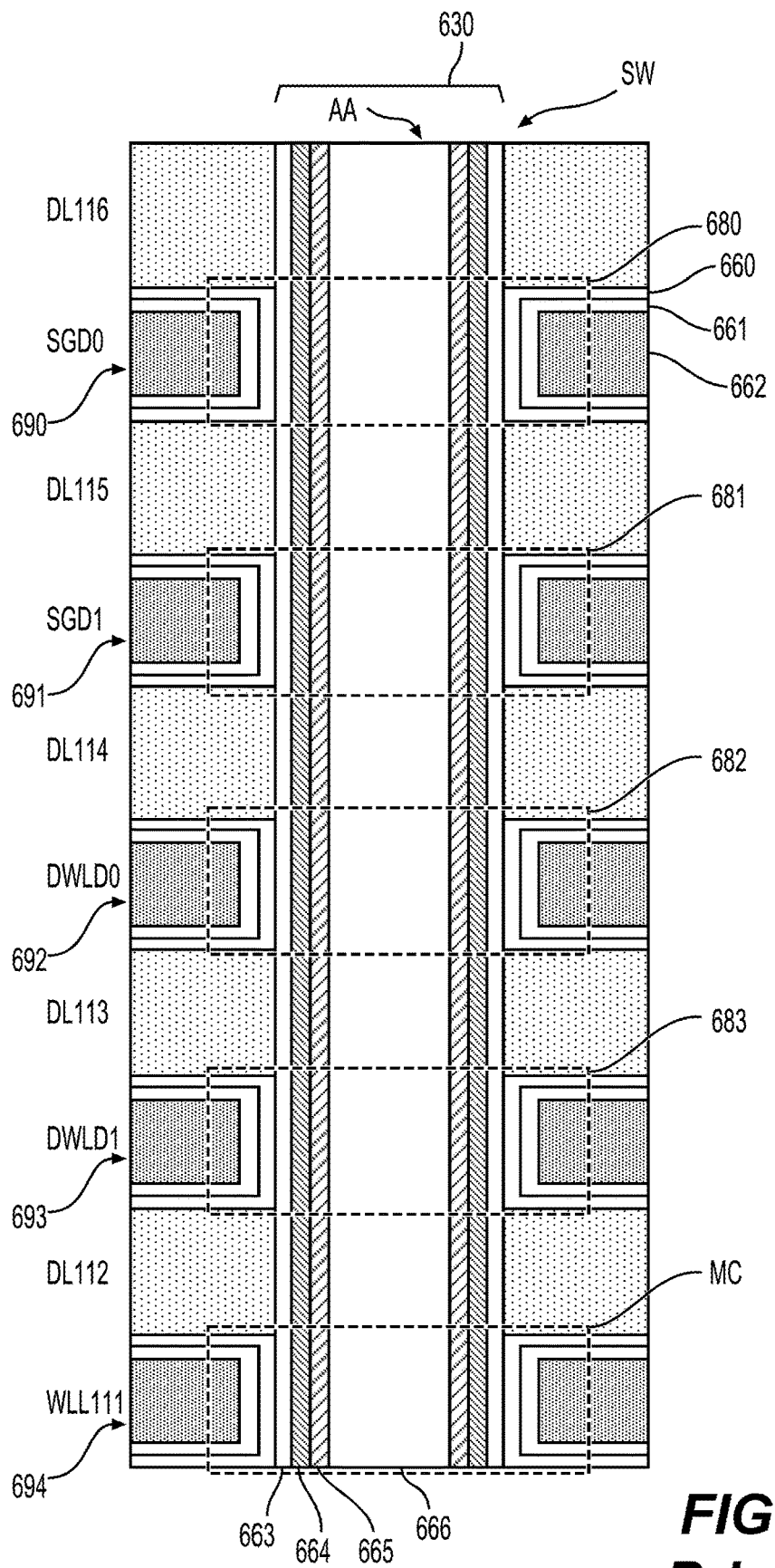
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 8:
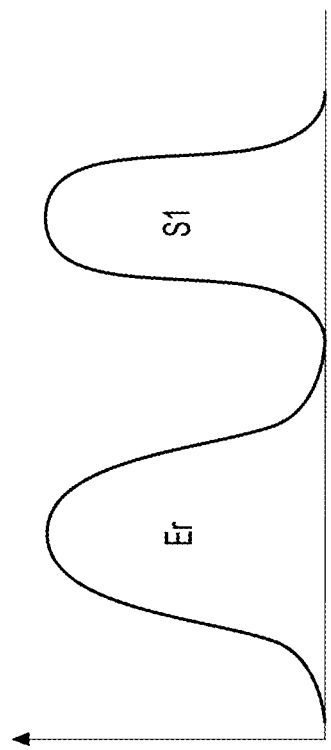
FIG. 8 depicts a threshold voltage distribution of a plurality of memory cells programmed to SLC (one bit per memory cell)
Figure 9:
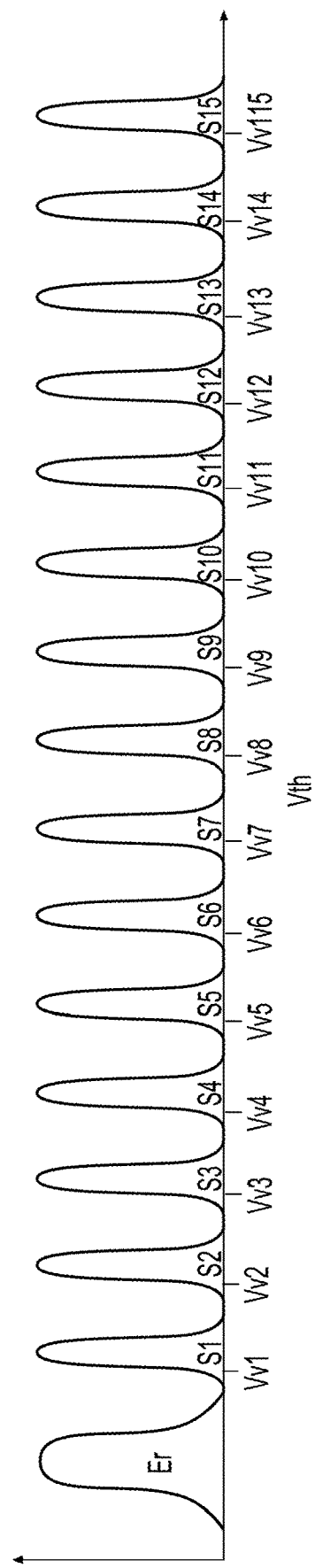
FIG. 9 depicts a threshold voltage distribution of a plurality of memory cells programmed to QLC (four bits per memory cell)

The memory cells can be programmed to store one or multiple bits of data in $2^n$ data states where n is a positive integer. Each data state is associated with a respective threshold voltage Vt. For example, FIG. 8 depicts a threshold voltage Vt distribution of a one bit per memory cell (SLC) storage scheme. In an SLC storage scheme, there are two total data states, including the erased state (Er) and a single programmed data state (S1). FIG. 9 illustrates the threshold voltage Vt distribution of a four bits per cell (QLC) storage scheme that includes sixteen total data states, namely the erased state (Er) and fifteen programmed data states (S1, S2, S3, S4, S5, S6, S7, S8, S9, S10, S11, S12, S13, S14, and S15). Each programmed data state (S1-S15) is associated with a verify voltage (Vv1-Vv15), which is employed during a verify portion of a programming operation, as discussed in further detail below. Other storage schemes are also available, such as two bits per cell (MLC) with four data states or three bits per cell (TLC) with eight data states.

Figure 10:
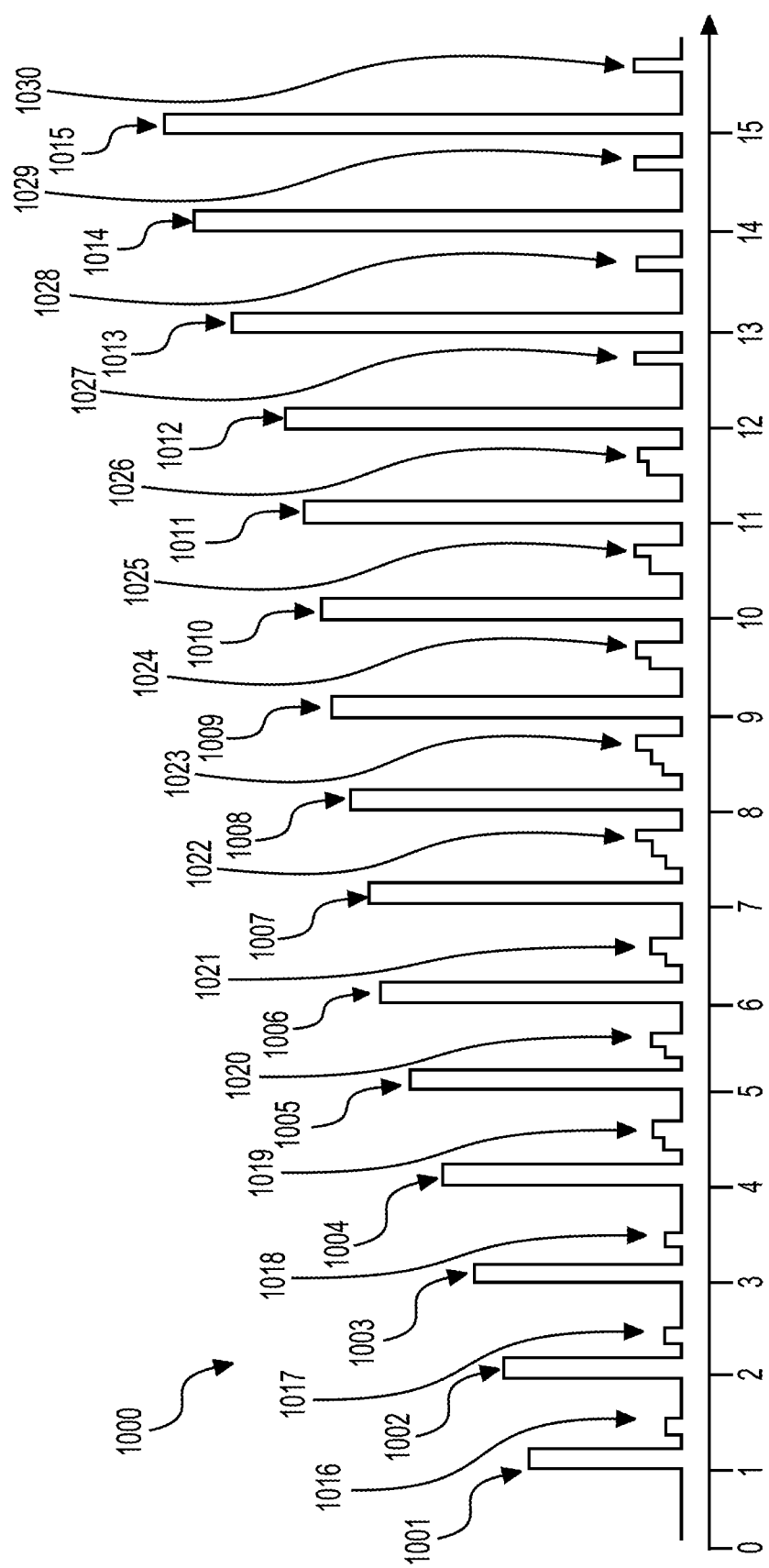
FIG. 10 depicts a voltage waveform applied to a control gate of a selected word line during an exemplary programming pass.

FIG. 10 depicts a waveform 1000 of an example memory cell programming operation for programming the memory cells to the programmed data states. The horizontal axis depicts time, and the vertical axis depicts control gate or word line voltage. Generally, a programming operation can involve applying a pulse train to a selected word line, where the pulse train includes multiple program loops or program-verify iterations. Each program loop includes a programming Vpgm pulse and one or more verify pulses, depending on which data states are being programmed in a particular program loop. A square waveform is depicted for each pulse for simplicity; however, other shapes are possible, such as a multilevel shape or a ramped shape. Further, Incremental Step Pulse Programming (ISPP) is used in this example, in which the Vpgm pulse amplitude steps up in each successive program loop.

The pulse train includes Vpgm pulses that increase step-wise in amplitude with each program loop using a fixed step size (dVpgm). A new pulse train starts at an initial Vpgm pulse level and ends at a final Vpgm pulse level which does not exceed a maximum allowed level. The pulse train 1000 includes a series of Vpgm pulses 1001-1015 that are applied to a selected word line that includes a set of non-volatile memory cells. One or more verify voltage pulses 1016-1029 are provided after each Vpgm pulse as an example, based on the target data states which are being verified. The verify voltages correspond with the voltages Vv1-Vv15 (shown in FIG. 9) depending on the particular data states that are being programmed in a given program loop or may be altered by one or more offset voltages, as discussed in further detail below.

Programming of the memory cells of a selected word line can be conducted in either a full sequence programming operation or a multi-pass programming operation. In a full-sequence programming operation, the memory cells are programmed directly to their final threshold voltages in a single programming pass. In a multi-pass programming operation, the memory cells are programmed to their final programmed data states in two or more programming passes or stages, e.g., a first pass and a second pass. In a multi-pass programming operation, during each pass, the voltage waveform may resemble the voltage waveform discussed above and illustrated in FIG. 10. Multi-pass programming operations can result in tighter threshold voltage distributions as compared to full-sequence programming operations by improving short term data retention (STDR).

Figure 11:
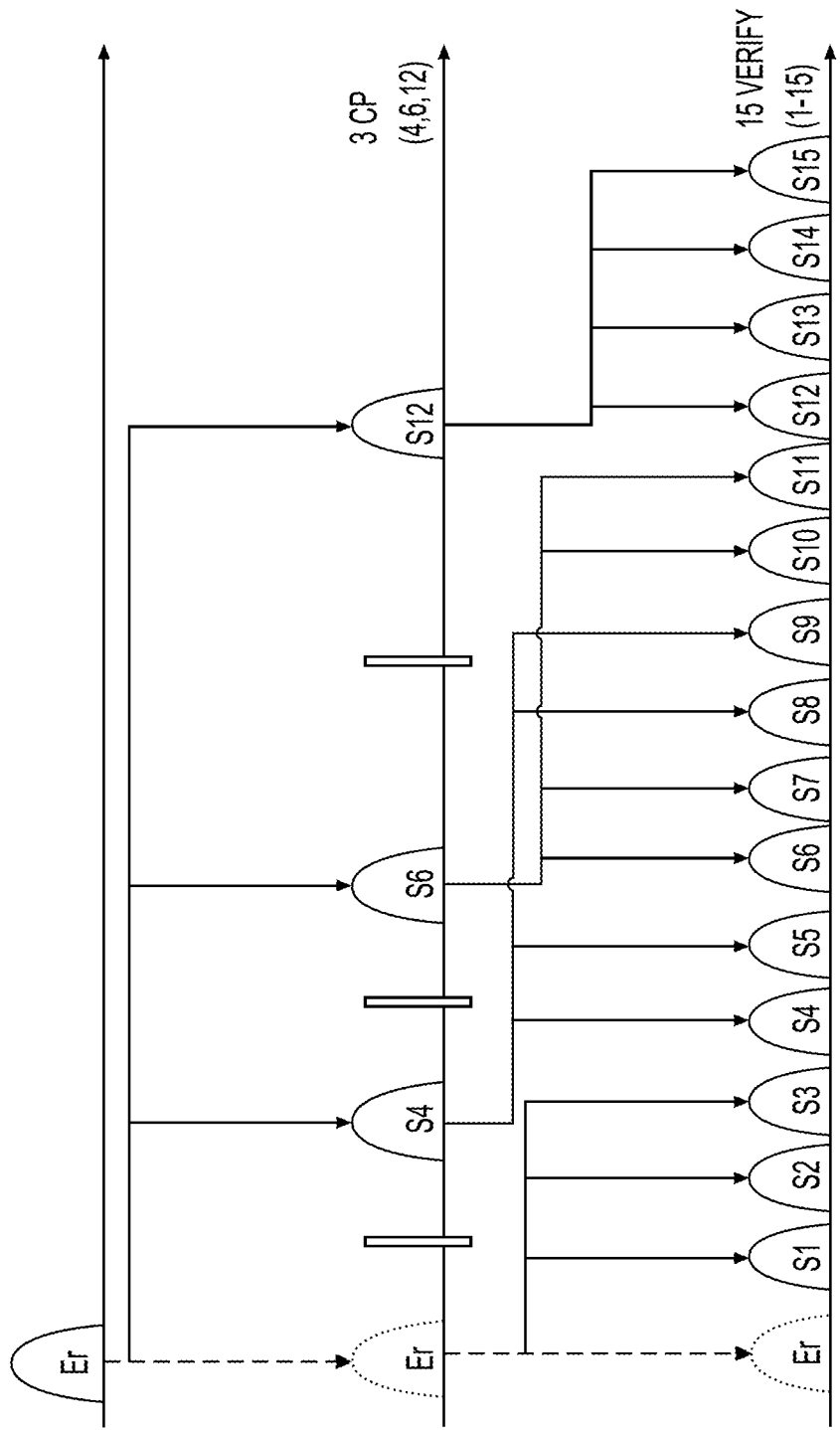
FIG. 11 depicts the voltage waveforms at different stages of an example multi-pass programming operation.

One type of multi-pass programming operation that ultimately programs the memory cells to QLC (four bits per memory cell) is sometimes known as "MLC-fine" and is depicted in FIG. 11. In a first programming pass (hereinafter referred to as an "MLC pass"), rather than programming the memory cells of the word line to all of the programmed data states S1-S15, the memory cells are either left in the erase Er data state or are programmed to one of a first set of data states, namely three data states, e.g., the S4, S6, and S12 data states. A relatively large voltage step size dVpgm may be used to increase the programming voltage between programming loops in the first pass to reduce programming time. In the MLC pass, two pages of data are programmed into the selected word line.

In a second programming pass (hereinafter referred to as a "fine pass"), the memory cells are programmed from the first set of data states to a second set of data states. In an example, the memory cells in the Er state following the MLC pass are either left in the Er state or are programmed to the S1, S2, or S3 data states; the memory cells in the S4 data state are either left in the S4 data state or programmed to the S5, S10, or S11 data states; the memory cells in the S6 data state are either left in the S6 data state or programmed to the S7, S10, or S11 data states; and the memory cells of the S12 data state are either left in the S12 data state or are programmed to the S13, S14, or S15 data states. In the fine pass, two additional pages of data are programmed into the selected word line such that when the fine pass is completed, the memory cells of the selected word line are in the QLC condition.

In some embodiments, the MLC pass may take different forms. For example, the memory cells can be programmed to different data states than the S4, S6, and S12 data states as described above. For example, in some embodiments, the memory cells can be programmed to the S4, S6, and S10 data states during the MLC pass.

In such MLC-fine programming operations, the fixed voltage step size dVpgm is greater during the MLC pass than during the fine pass to improve performance during the MLC pass because that the data can then be more accurately programmed during the fine programming pass. For example, in one embodiment, dVpgm in the MLC pass is approximately 0.55 Volts and dVpgm in the fine pass is 0.3 Volts.

Figure 12:
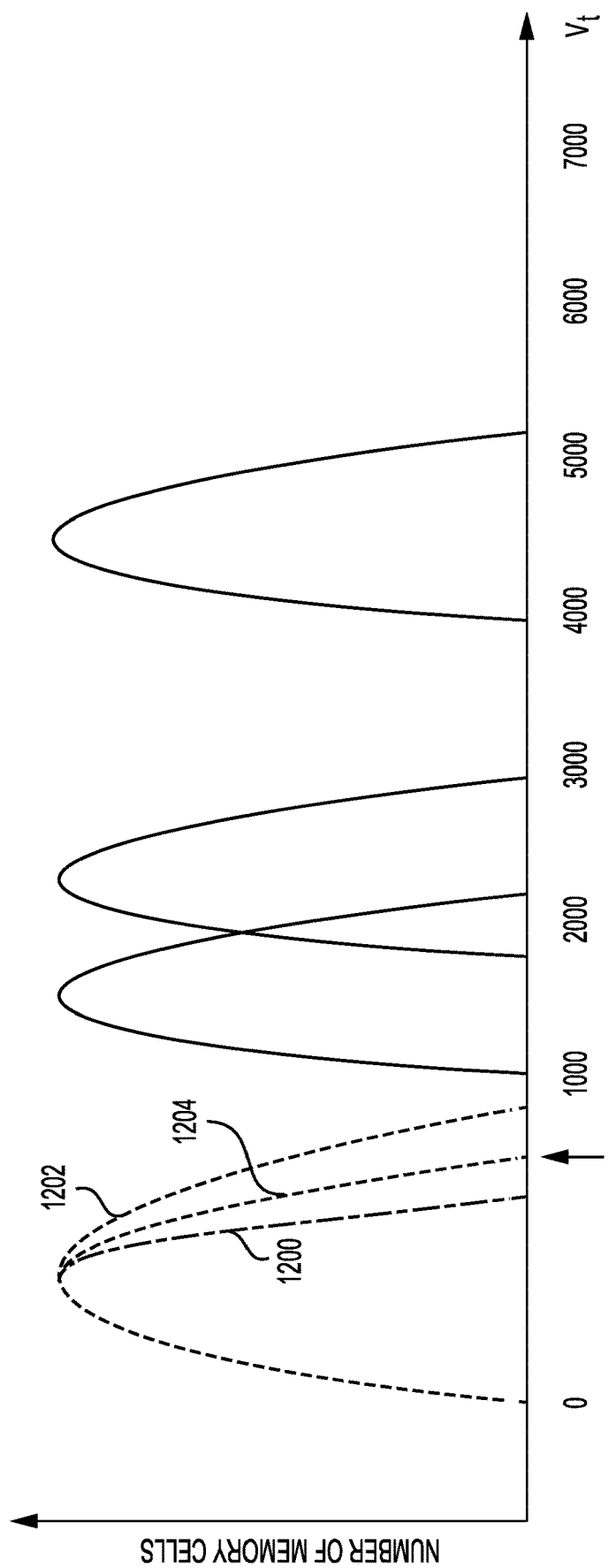
FIG. 12 depicts three threshold voltage distributions of memory cells of a word line following one, two, and three word lines being programmed with the MLC pass.

One potential consequence of utilizing a large dVpgm level during the MLC pass is known as neighboring word line attack (NWI attack) or program disturb, which is the unintentional programming of an unselected (or inhibited) memory cell during a programming operation that intends to program another memory cell. Program disturb can raise the threshold voltages of the erased memory cells of a first word line (for example, WL5) during the MLC pass of a neighboring word line WL4. For example, FIG. 12 illustrates a voltage distribution of a plurality of memory cells of a first word line WL0 programmed in the MLC pass following the application of the MLC pass to one, two, and three word lines (WL1, WL2, and WL3) adjacent the first word line WL0. As illustrated, the erase upper tail is normal following application of the MLC pass on only one word line WL1 (curve 1200); is slightly deformed following the application of the programming pass on two word lines WL1, WL2 (curve 1202); and is more greatly deformed following the application of the programming pass on three word lines WL1, WL2, and WL3 (curve 1204). The threshold voltages of memory cells cannot be lowered without conducting an erase operation, and therefore, program disturb can cause some of the memory cells that should be in the erase data state Er to unintentionally have their threshold voltages be raised above the verify level Vv1 of the S1 data state. Thus, the large erase upper tail produced by conducting the MLC programming pass on too many word lines before conducting the fine pass can result in read errors when the memory is read during use of the memory device.

However, increasing the number of word lines that are MLC programmed may improve performance by increasing bake time to de-trap shallow trapped charges within the memory cells, thereby improving STDR. Thus, there is a benefit to optimizing the number of word lines that are MLC programmed prior to the fine pass to maximize performance gains while minimizing the consequences of NWI attack.

Programming within each word line occurs on a string-by-string basis. According to some programming techniques, the fine pass on one word line immediately follows the MLC pass on a next word line. For example, the programming order follows the following pattern: MLC pass on WL0; MLC pass on WL1; Fine pass on WL0; MLC pass on WL2; Fine pass on WL1; MLC pass on WL3; Fine pass on WL2; MLC pass on WL4; Fine pass on WL3; and so on until both of the MLC and fine passes have been completed on all word lines of the memory block.

According to an aspect of the present disclosure, a programming order is provided to dynamically control the programming of a memory block such that the number of word lines that are programmed to MLC before the fine pass is optimized. By conducting the MLC pass on multiple word lines prior to beginning the fine pass, data state width can be reduced (improved) by de-trapping shallow trapped charges due to STDR. As discussed in further detail below, the effects of NWI attack are mitigated by checking the upper tail of the first programmed word line WL0 after the MLC pass is conducted on each additional word line until the optimum number is determined. Once a number of memory cells of WL0 that should be in the erased data state Er exceed a critical threshold voltage level Vcr, then the fine pass is performed on WL0 and checking of the upper tail of the Er data state of WL0 can be ceased. In other words, the benefits of STDR are realized without causing read errors down the road.

Figure 13:
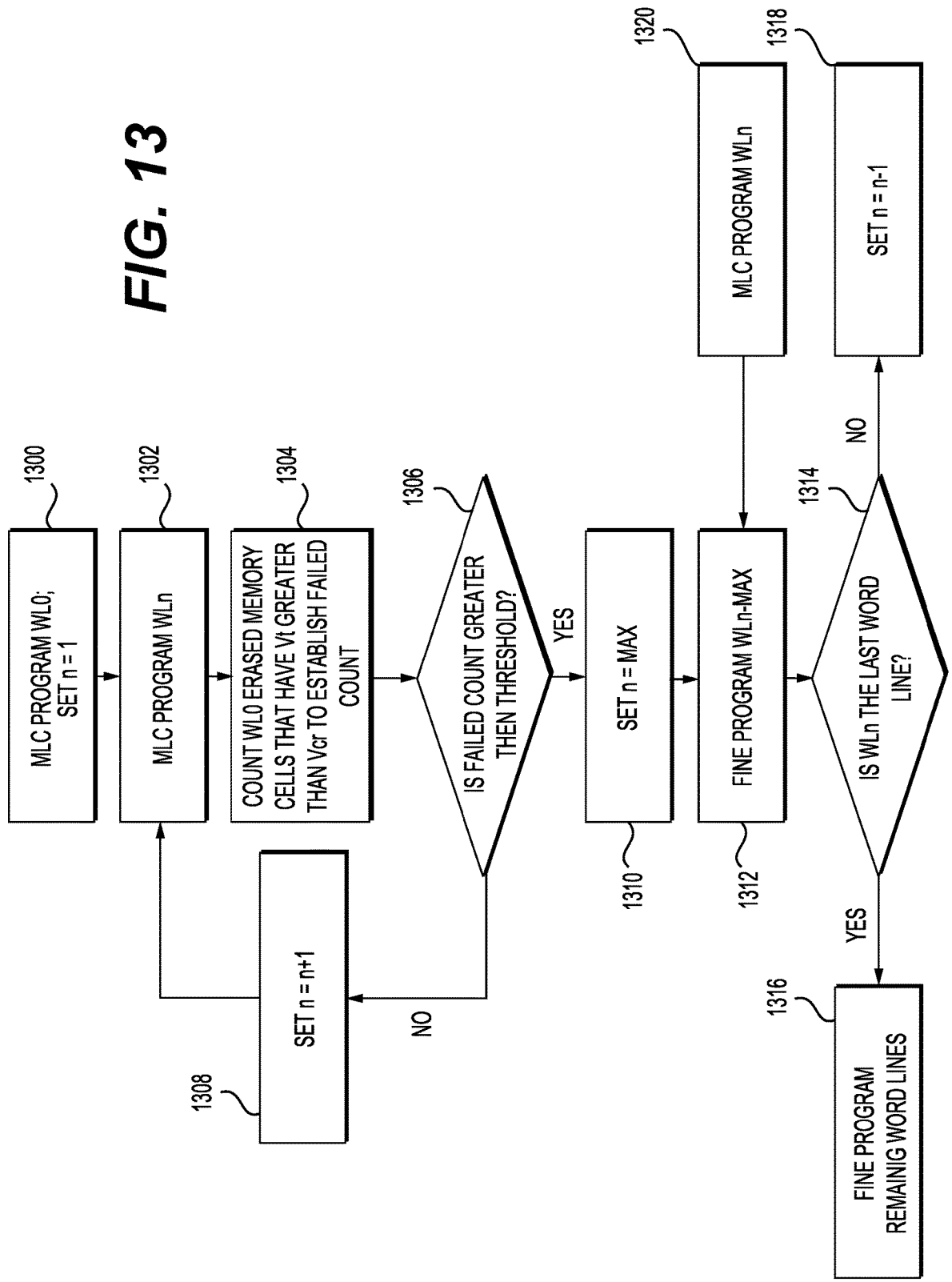
FIG. 13 is a flow chart depicting the steps of programming the memory cells of a memory block according to one embodiment of the present disclosure.

FIG. 13 is a flow chart depicting the steps of programming the word lines of a memory block. At step 1300, the MLC pass is performed on a first word line WL0 in the memory block. The MLC pass is performed sequentially on a string-by-string basis until all memory cells of WL0 are programmed. Also at this step, a variable n is set to 1.

At step 1302, the MLC pass is performed on the word line WLn.

At step 1304, a verify operation is performed on word line WL0 to count the number of memory cells that should be in the erased state that have threshold voltages which are greater than a critical voltage Vcr to establish a Failed Count. The critical voltage Vcr is less than a verify voltage associated with the first programmed data state S1. Thus, at step 1304, the upper tail of the erased data state is measured.

At decision step 1306, it is determined if the Failed Count is greater than a threshold. The threshold number is may be based on a bit scan pass fail (BSPF) number of failed memory cells that the error correction code of the memory device can correct.

If the answer at decision step 1306 is "no," then at step 1308, the variable n is incrementally advanced, i.e., n=n+1. The process then returns back to step 1302. The process continues through a first loop of steps 1302-1308 until the Failed Count is greater than the threshold. In other words, MLC programming continues until the upper tail of the memory cells in the erased data state reaches a threshold that is pre-established in the memory device. From this point on, programming of the word lines of the memory block will alternate between the MLC and fine passes.

If the answer at decision step 1306 is "yes," then the process proceeds to step 1310. At step 1310, the value of n is set to the constant MAX, which is one less than the number of word lines that are programmed to MLC at this stage after accounting for WL0. For example, if three word lines (WL0-WL2) have been programmed to MLC at the time that the answer at decision step 1306 is "yes," then MAX will be set to two (2).

At step 1312, the fine programming pass is performed on WL(n-MAX). In the first instance of step 1312, n and MAX will be equal, and thus, the fine programming pass will be performed on WL0.

At decision step 1314, it is determined if WLn is the last word line to be programmed in the memory block. In one example embodiment, the last word line to be programmed is WL111. However, in other embodiments, the memory block may include more or fewer word lines than this.

If the answer at decision step 1314 is "yes," then at step 1316, the process proceeds with performing the fine pass on the remaining word lines, i.e., from WL(n-MAX) to WLn. Once the fine pass is completed on all word lines, then the process is completed.

If the answer at decision step 1318 is "no," then the variable n is incrementally advanced, i.e., n=n+1. At step 1320, the MLC pass is performed on word line WLn.

The process proceeds through this second loop of steps 1312, 1314, 1318, 1320 until the MLC pass is performed on all word lines of the memory block. In this second loop, programming alternates between the MLC pass on word line WLn at step 1320 and the fine pass on word line WL(n-MAX) at step 1312. Thus, the number of word lines programmed to MLC at any given point does not exceed MAX+1 through the entire programming operation.

By dynamically determining the maximum number of word lines to be programmed to MLC, on a memory block level, the benefits of STDR are realized without the potential consequences of NWI attack overriding the ability of the ECC engine of the memory device to correct read errors. Specifically, in one embodiment, the average threshold voltage width for each data state of memory cells programmed to QLC is reduced by approximately forty millivolts (40 mV). This is done on a block level, and thus, performance is optimized for each individual block, thereby allowing for these gains without compromising reliability due to die by die, lower memory hole to upper memory hole, string to string, word line zone to word line zone differences. For example, in a word line zone with good program disturb, more word lines can be programmed to MLC before fine programming begins and in a word line zone with bad program disturb, fewer word lines can be programmed to MLC before fine programming begins.

Turning now to FIG. 14, a chart depicting the order of programming is provided in an example memory block where MAX in this particular memory block is dynamically determined to be two, i.e., three word lines are programmed to MLC prior fine programming. In this example, the MLC pass starts, in order, on WL0, String_0; WL0, String_1; WL0, String_2; WL0, String 3; WL1, String_0; WL1, String_1; WL1, String_2; WL1, String_3; WL2, String_0; WL2, String_1; WL2, String_2; and WL2, String_3. At this point, for this memory block, the Failed Count exceeds the threshold and the answer at decision step 1306 (see the flow chart of FIG. 13) is "yes." Programming thus proceeds to the second loop and alternates between the MLC and fine passes.

The thirteenth operation thus is the fine pass on WL0, String_0. Programming then continues, in order, with: the fine pass on WL0, String_1; the fine pass on WL0, String_2; the fine pass on WL0, String_3; the MLC pass on W3, String_0; the MLC pass on W3, String_1; the MLC pass on W3, String_2; the MLC pass on W3, String_3; the fine pass on WL1, String_0; the fine pass on WL1, String_1; the fine pass on WL1, String_2; the fine pass on WL1, String_3; and so on.

In this embodiment, the programming order for the MLC pass on any word line WLn, String_X combination is governed by the formula Order=4n+(X−1); and the programming order for the fine pass on any word line WLn, String_X combination is governed by the formula Order=4n+4MAX+(X−1).

Figure 15:
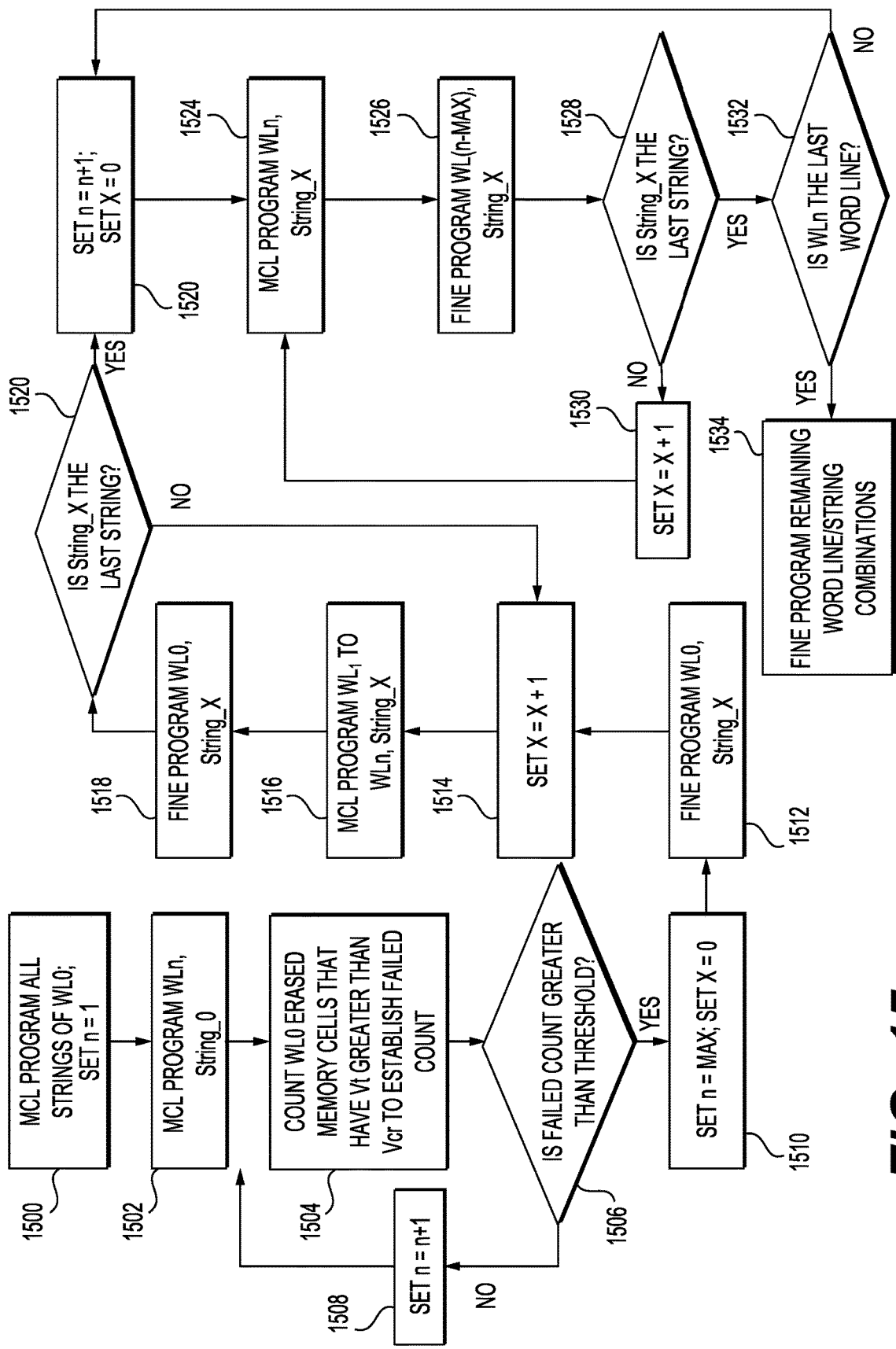
FIG. 15 is a flow chart depicting the steps of programming the memory cells of a memory block according to another embodiment of the present disclosure.

Turning now to FIG. 15, a flow chart depicting another exemplary embodiment is provided. In this embodiment, the programming order focuses on strings and then word line. That is, in this embodiment, the maximum number of word lines to be programmed to MLC before fine programming is established using String_0 to determine MAX. Then, once MAX is established, for each strings, MLC is conducted on MAX word lines before fine programming is performed.

At step 1500, the MLC pass is performed on the memory cells of all strings of the first logical word line WL0. Also at this step, the variable "n" is set to a value of one, i.e., n=1.

At step 1502, the MLC pass is performed on the word line WLn, String_0. At step 1504, a sensing operation is performed on the word line WL0, and the memory cells having threshold voltages greater than the critical voltage Vcr are counted to establish Failed Count.

At decision step 1506, it is determined if Failed Count is greater than the predetermined threshold. If the answer at decision step 1506 is no, then at step 1508, the variable "n" is incrementally advanced, i.e., n=n+1. The process then returns to step 1502 to String_0 of the next sequential word line.

A first loop of steps 1502-1508 is repeated until the answer at decision step 1506 is "no," thereby establishing the number of word lines that can be programmed to MLC before the fine pass begins.

If the answer at decision step 1506 is "yes," then at step 1510, and the variable MAX to the value of "n" and the variable "X" is set to 0. At step 1512, the fine pass is performed on the first word line WL, String_X.

At step 1514, the variable "X" is incrementally advanced, i.e., X=X+1. At step 1516, the MLC pass is performed on word lines WL-WLn, String_X. At step 1518, the fine pass is performed on WL0, String_X.

At decision step 1520, it is determined if String_X is the last string of the memory block. If the answer at decision step 1520 is "no," then the process returns to step 1514.

If the answer at decision step 1520 is "yes," then at this point in the process, a second loop begins whereby programming alternates between the MLC pass for one word line/string combination in word line WLn and another word line/string combination in the word line WL(n-MAX).

At step 1522, the variables "n" and "X" are incrementally advanced, i.e., n=n+1 and X=X+1. At step 1524, the MLC pass is performed on WLn, String_X. At step 1526, the fine pass is performed on WL(n-MAX), String_X.

At decision step 1528, it is determined if String_X is the last string of the memory block. If the answer at decision step 1528 is "no," then at step 1530, the variable "X" is incrementally advanced, i.e., X=X+1. The process then returns to step 1524.

If the answer at decision step 1528 is "yes," then the process proceeds to step 1532. At decision step 1532, it is determined if WLn is the last word line in the memory block. If the answer at decision step 1532 is "yes," then at step 1534, the MLC pass has been performed on all word line/string combinations and the fine programming pass is performed on the remaining word line/string combinations until programming of the entire block is completed. If the answer at decision step 1532 is "no," then the process returns to step 1522.

Turning now to FIG. 16, a chart is provided depicting the order of programming according to the flow chart of FIG. 15 where MAX in this particular example memory block is dynamically determined to be two, i.e., three word lines are programmed to MLC prior fine programming. In this example, the MLC pass starts with programming all four strings (String_0 through String_3) of the first word line WL0. Thus, in order, programming begins with the MLC pass on, in order, on WL0, String_0; WL0, String_1; WL0, String_2; WL0, String_3; WL1, String_0. Next, while focusing on only String_0, programming continues with programming WL1, String_0; WL2, String_0; and WL3, String_0.

At this point in the programming operation, it is determined that Failed Count has exceeded the threshold (see step 1506 of FIG. 15), and fine programming is to begin. The programming order then follows the following pattern to complete fine programming on WL0 and MLC programming on the word lines WL1-WL3. The programming order continues as follows: fine pass on WL0, String_0; MLC pass on WL1, String_1; MLC pass on WL2, String_1; MLC pass on WL3, String_1; fine pass on WL0, String_2; MLC pass on WL1, String_2; MLC pass on WL2, String_2; MLC pass on WL3, String_2; fine pass on WL0, String_3; MLC pass on WL1, String_3; MLC pass on WL2, String_3; MLC pass on WL3, String_3; and fine pass on WL0, String_3.

Next in the process, programming begins alternating between the MLC and fine passes until MLC programming is completed on all strings of all word lines. Specifically, programming follows the following order: MLC pass on WL4, String_0, fine pass on WL1, String_0; MLC pass on WL4, String_1, fine pass on WL1, String_1; MLC pass on WL4, String_2; fine pass on WL4 String2; MLC pass on WL4, String_3; fine pass on WL1, String_3; MLC pass on WL5, String_0; fine pass on WL2, String_0, MLC pass on WL5, String_1; fine pass on WL2, String_1; and so on until the MLC pass is performed on all word line/string combinations. Finally, the fine pass is performed on all remaining word line/string combinations to complete the programming operation.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming memory cells of a memory device that includes a memory block having a plurality of memory cells arranged in a plurality of word lines, the method comprising:
performing a first programming pass on a first word line of the plurality of word lines;
subsequent to performing the first programming pass on the first word line and prior to performing a second programming pass on the first word line, repeating steps process of (i) performing the first programming pass on at least a portion of another word line of the plurality of word lines, (ii) comparing an upper tail of an erased data state of the first word line to a critical voltage, and (iii) determining whether the upper tail of the erased data state of the first word line exceeds the critical voltage by a threshold;
in response to determining that the upper tail of the erased data state exceeds the critical voltage by the threshold subsequent to performing the first programming pass on the at least a portion of the another word line, alternating between the first and second programming passes until the first programming pass is completed on the remaining word lines of the memory block; and
in response to determining that the upper tail of the erased data state does not exceed the critical voltage by the threshold subsequent to performing the first programming pass on the at least a portion of the another word line, continuing the process of (i) performing the first programming pass on the at least a portion of the another word line of the plurality of word lines, (ii) comparing the upper tail of an erased data state of the first word line to the critical voltage, and (Hi) determining whether the upper tail of the erased data state of the first word line exceeds the critical voltage by the threshold.

2. The method as set forth in claim 1 wherein the first programming pass is an MLC programming pass and a first set of data states includes the erased data state and three programmed data states.

3. The method as set forth in claim 2 wherein the second programming pass is a fine programming pass and a second set of data state includes the erased data state and fifteen programmed data states.

4. The method as set forth in claim 3 wherein the step of comparing the upper tail of the erased data state of the first word line to the critical voltage includes performing a sensing operation on the first word line and counting a number of memory cells in the erased data state that have threshold voltages that are greater than the critical voltage.

5. The method as set forth in claim 4 wherein the memory block includes a plurality of strings and the step of programming at least a portion of the another word line includes programming the memory cells of all strings of the another word line.

6. The method as set forth in claim 4 wherein the memory block includes a plurality of strings and the step of programming at least a portion of the another word line includes programming the memory cells of only a single string of the another word line.

7. The method as set forth in claim 4 wherein upon completion of the MLC programming pass on all of the word lines of the memory block, the method continues with the step of performing the fine programming pass on any word lines that have only received the MLC programming pass.

8. A memory device, comprising:
a memory block including a plurality of memory cells arranged in a plurality of word lines;
a controller in electrical communication with the plurality of memory cells, the controller being configured to program the memory cells to a first set of data states in a first programming pass and to a second set of data states that is greater than the first set of data states in a second programming pass, the controller being further configured to:
perform the first programming pass on a first word line of the plurality of word lines;
subsequent to performing the first programming pass on the first word line and prior to performing a second programming pass on the first word line, repeat a process of (i) performing the first programming pass on at least a portion of another word line of the plurality of word lines, (ii) comparing an upper tail of an erased data state of the first word line to a critical voltage, and (iii) determining whether the upper tail of the erased data state of the first word line exceeds the critical voltage by a threshold;
in response to determining that the upper tail of the erased data state exceeds the critical voltage by the threshold subsequent to performing the first programming pass on the at least a portion of the another word line, alternate between the first and second programming passes until the first programming pass is completed on the remaining word lines of the memory block; and in response to determining that the upper tail of the erased data state does not exceed the critical voltage by the threshold subsequent to performing the first programming pass on the at least a portion of the another word line, continue the process of (i) performing the first programming pass on the at least a portion of the another word line of the plurality of word lines, (ii) comparing the upper tail of an erased data state of the first word line to the critical voltage, and (Hi) determining whether the upper tail of the erased data state of the first word line exceeds the critical voltage by the threshold.

9. The memory device as set forth in claim 8 wherein the first programming pass is an MLC programming pass and a first set of data states includes the erased data state and three programmed data states.

10. The memory device as set forth in claim 9 wherein the second programming pass is a fine programming pass and a second set of data state includes the erased data state and fifteen programmed data states.

11. The memory device as set forth in claim 10 wherein when comparing the upper tail of the erased data state of the first word line to the critical voltage, the controller performs a sensing operation on the first word line and counts a number of memory cells in the erased data state that have threshold voltages that are greater than the critical voltage.

12. The memory device as set forth in claim 11 wherein the memory block includes a plurality of strings and when programming the at least a portion of the another word line, the controller is configured to program the memory cells of all strings of the another word line.

13. The memory device as set forth in claim 11 wherein the memory block includes a plurality of strings and when programming the at least a portion of the another word line, the controller is configured to program the memory cells of only a single string of the another word line.

14. The memory device as set forth in claim 11 wherein upon completion of the MLC programming pass on all of the word lines of the memory block, the controller is further configured to perform the fine programming pass on any word lines that have only received the MLC programming pass.

15. An apparatus, comprising:
a memory block including a plurality of memory cells arranged in a plurality of word lines;
a programming means for programming the plurality of memory cells to a first set of data states in a first programming pass and to a second set of data states that is greater than the first set of data states in a second programming pass, the programming means being further configured to:
perform the first programming pass on a first word line of the plurality of word lines;
subsequent to performing the first programming pass on the first word line and prior to performing a second programming pass on the first word line, repeat a process of (i) performing the first programming pass on at least a portion of another word line of the plurality of word lines, (ii) determining a failed count of a number of memory cells in an erased data state of the first word line that have threshold voltages that are greater than a critical voltage, and (iii) determining whether the failed count exceeds a threshold;

in response to determining that the failed count exceeds the threshold subsequent to performing the first programming pass on the at least a portion of the another word line, alternate between the first and second programming passes until the first programming pass is completed on the remaining word lines of the memory block; and in response to determining that the failed count does not exceed the threshold subsequent to performing the first programming pass on the at least a portion of the another word line, continue the process of (i) performing the first programming pass on the at least a portion of the another word line of the plurality of word lines, (ii) determining the failed count of the number of memory cells in the erased data state of the first word line that have threshold voltages that are greater than the critical voltage, and (iii) determining whether the failed count exceeds the threshold.

16. The apparatus as set forth in claim 15 wherein the first programming pass is an MLC programming pass and a first set of data states includes the erased data state and three programmed data states.

17. The apparatus as set forth in claim 16 wherein the second programming pass is a fine programming pass and a second set of data state includes the erased data state and fifteen programmed data states.

18. The apparatus as set forth in claim 17 wherein the memory block includes a plurality of strings and when programming the at least a portion of the another word line, the programming means is configured to program the memory cells of all strings of the another word line.

19. The apparatus as set forth in claim 17 wherein the memory block includes a plurality of strings and when programming the at least a portion of the another word line, the programming means is configured to program the memory cells of only a single string of the another word line.

20. The apparatus as set forth in claim 17 wherein upon completion of the MLC programming pass on all of the word lines of the memory block, the programming means is further configured to perform the fine programming pass on any word lines that have only received the MLC programming pass.

\* \* \* \* \*